United States Patent

Wootton

(10) Patent No.: US 9,276,152 B2
(45) Date of Patent: Mar. 1, 2016

(54) PHOTOVOLTAIC CELL TABS AND METHOD AND SYSTEM FOR FORMING SAME

(75) Inventor: Gerald R. Wootton, Cambridge (CA)

(73) Assignee: ATS AUTOMATION TOOLING SYSTEMS INC., Cambridge, Ontario (CA)

(*) Notice: Subject to any disclaimer, the term of this patent is extended or adjusted under 35 U.S.C. 154(b) by 249 days.

(21) Appl. No.: 13/437,522

(22) Filed: Apr. 2, 2012

(65) Prior Publication Data

US 2012/0247554 A1 Oct. 4, 2012

Related U.S. Application Data

(60) Provisional application No. 61/470,400, filed on Mar. 31, 2011.

(51) Int. Cl.
*H01L 31/044* (2014.01)
*H01L 31/05* (2014.01)
*H01L 31/054* (2014.01)

(52) U.S. Cl.
CPC ........ *H01L 31/0508* (2013.01); *H01L 31/0547* (2014.12); *Y02E 10/52* (2013.01); *Y10T 29/49174* (2015.01); *Y10T 29/53213* (2015.01)

(58) Field of Classification Search
CPC ........ H01L 31/00–31/208; Y02E 10/50–10/60
USPC .................................................. 136/243–265
See application file for complete search history.

(56) References Cited

U.S. PATENT DOCUMENTS

| | | | | |
|---|---|---|---|---|
| 4,235,643 A * | 11/1980 | Amick | ........................ | 136/246 |
| 4,301,322 A | 11/1981 | Amick | | |
| 2007/0125415 A1 * | 6/2007 | Sachs | ........................ | 136/205 |
| 2007/0283996 A1 * | 12/2007 | Hachtmann et al. | ......... | 136/244 |
| 2009/0145479 A1 | 6/2009 | Williams | | |
| 2010/0243059 A1 * | 9/2010 | Okaniwa | ...................... | 136/261 |
| 2011/0005568 A1 | 1/2011 | Kim et al. | | |

FOREIGN PATENT DOCUMENTS

EP 2009701 12/2008
JP 2007273857 10/2007
JP WO2009/063841 * 5/2009

OTHER PUBLICATIONS

International Searching Authority (CA), International Search Report and Written Opinion for International Patent App. No. PCT/CA2012/050210, Jun. 29, 2012.

(Continued)

*Primary Examiner* — Bach Dinh
(74) *Attorney, Agent, or Firm* — Gowling Lafleur Henderson LLP; Neil Henderson

(57) ABSTRACT

A photovoltaic cell tab including: a front contact portion having a first profile; and a back contact portion having a second profile, wherein the first profile or second profile are complex shapes that may be dissimilar to each other. A system and method for forming photovoltaic cell tabs comprising: a feeding mechanism to feed wire; a first forming tool to trim and shape the wire to tabs; and a placement tool configured to match a profile of the tabs and place and attach the tabs on photovoltaic cells. In the system and method, the tabs may be formed to have a complex profile or shape that will affect incident light and/or mechanical or other characteristics of the tabs.

16 Claims, 7 Drawing Sheets

(56) References Cited

OTHER PUBLICATIONS

European Patent Office, Extended European Search Report for EP Appln. No. 12765011.7, dated Jul. 18, 2014.

Japan Patent Office, Patent Abstract of Japan for Japanese Patent Application No. 2007273857, Oct. 18, 2007.

State Intellectual Property Office of China, Notification of the First Official Action for Chinese Patent App. No. 201280024622.7, May 6, 2015.

* cited by examiner

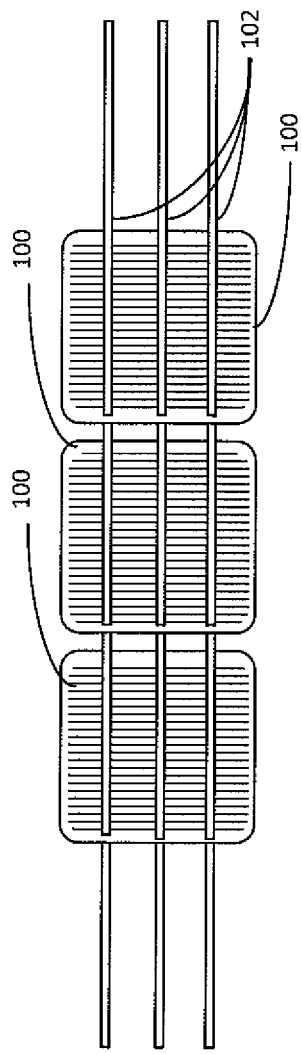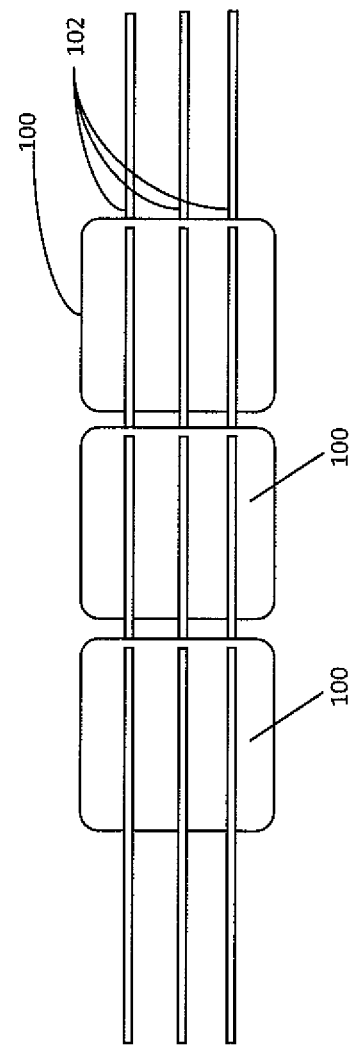

PHOTOVOLTAIC CELL TABS AND METHOD AND SYSTEM FOR FORMING SAME

CROSS REFERENCE TO RELATED APPLICATIONS

The application claims the benefit of priority to U.S. Provisional Patent Application No. 61/470,400 filed Mar. 31, 2011, which is incorporated herein by reference.

FIELD

The present disclosure relates generally to photovoltaic cells. More particularly, the present disclosure relates to a method and system for forming photovoltaic cell tabs.

BACKGROUND

A typical photovoltaic cell has a photosensitive substrate and converts light into energy. Conductors, also known as tabs, are attached to the photovoltaic cells and are typically made of flat wire or ribbon wire. Flat wire is pulled from a spool, straightened, flattened and pretensioned then cut to length to form individual tabs. In some cases, a Z-bend may be formed in the ribbon wire to accommodate a transition from the front of one cell to the back of an adjacent cell. The conventional practice results in a trade-off between the surface area covered on the front side of the photovoltaic cell and the net series resistance of the photovoltaic cell string determined by the cross section of the tab. As the ribbon width is increased and, to a lesser extent, as the ribbon thickness is increased, the amount of surface area of the photovoltaic cell that is occluded increases, which tends to sacrifice optical efficiency for reduced series resistance. For example, a 156 millimeter (mm) cell with 2 mm tabs may have approximately 2.56% of the light blocked but may have significant series resistance. Increasing the tab to 3 mm may reduce series resistance by approximately 33 percent but increases the area blocked by 50 percent.

The use of a conventional fire-through metalization process can be used to form front metal contacts on a photovoltaic cell. A wider area of metalization forming a contact on the front of the cell in order to accommodate wider tabs may promote localized heating during the process, which may increase the degree to which shunts, that is, places where the semiconductor junction is damaged, are formed. On the other hand, reducing tab resistance by increasing thickness has the effect of increasing the overall thickness of the string of cells which can make the subsequent lamination process more difficult and induce additional mechanical stress on the cells. Commonly, a solder contact is produced by scavenging solder previously applied to the ribbon wire. This solder is typically applied to both sides of the wire resulting in increased thickness while more than half of this material is not used since it is on a surface that does not come into contact with a cell. Since lead free solders contain a substantial amount of silver, this is an objectionable expense. Generally, in order to accommodate variation in the width of ribbon wire as supplied, the front contacts of a cell are made at least as wide as or somewhat wider than the ribbon wire, with a minor loss of cell efficiency. An additional problem is that tabs experience thermal expansion and contraction during any thermal method of attaching tabs to cells which can result in stresses applied to the cell due to differential thermal expansion and contraction. This is generally ameliorated by pre-tensioning the wire during the tabbing-stringing process but this is generally considered a weak solution which is less effective as the thickness of solar cells is reduced.

Typically, tabs are formed from flat wire; however, another option may be to form the wire with a faceted top surface such that incident light is reflected at a sufficient angle to be trapped inside the module, by total internal reflection, and reflected onto the active area of the cells (for example Light-Capturing Ribbon supplied by Ulbrich). However, this option may have a negative impact on the attachment of tabs to back contacts where the facets can serve no optical purpose but provide a more difficult surface to attach to the back contacts of the cell. Furthermore, this approach results in a thickening of the tab along its entire length in order to form facets while maintaining the desired conductor cross section where only the front contact portion serves a purpose.

It is, therefore, desirable to provide systems and methods intended to overcome at least some of the problems of conventional systems and methods and improve the forming of the tabs for photovoltaic cells and the tabs themselves.

SUMMARY

This disclosure describes a method for forming tabs for photovoltaic cells that is intended to provide benefits that may include: reduce shadowing; reduce series resistance; increase light capture; and reduce silver and tin usage.

According to a first aspect herein, there is provided a photovoltaic cell tab comprising: a front contact portion having a first profile; and a back contact portion having a second profile, wherein the first profile or second profile are complex shapes that may be dissimilar to each other.

It is intended that providing complex profiles for the front contact portion or the back contact portion will allow for various benefits, including, for example: a narrower front contact width can provide improved efficiency; a narrower front contact provides improved light capture and therefore improved efficiency and reduced tab visibility. The first and second profiles can also be configured to provide improved mechanical properties for handling, placement or the like, for example, stiffness, locating features, improved dimensional tolerances, all of which can contribute to improved process yield; a thinner back contact portion can result in improved lamination process yield; a non-grooved back contact portion can provide improved contact formation.

In a particular case, the first profile may include angular facets configured to affect incident light in a predetermined manner. In this case, the angular facets may be configured to reflect incident light obliquely; configured to reflect incident light such that it fails on active portions of the cell to produce photocurrent; configured to reduce the amount of incident light that is visibly reflected thereby making the tab less visible; configured as ridges (peaks) and grooves (valleys) in longitudinal, transverse or complex patterns; configured into an exposed side of the tab while an opposite side of the tab, which makes contact with the cell, presents a substantially flat surface or some combination of these features or other features that would be known to one of skill in the art on reading this disclosure.

In another particular case, the second profile may not include angular facets.

In yet another particular case the photovoltaic cell tab may have only one side of the tab tinned. In this case, the tab may be configured so that the tinned side of the tab makes contact with both the front contact area of one cell and the back contact area of another cell.

In still yet another particular case, the photovoltaic cell tab may be tapered. In this case, the taper may be provided to the front contact portion of the tab, the back contact portion of the tab, or both. As a particular example, the width of the tab may be between approximately 1 mm and 1.4 mm.

In still another particular case, the first profile or second profile or both may be configured to affect a mechanical, processing or other characteristic of the tab. For example, the first or second profile may be configured to increase the lateral stiffness of the tab; configured to make the back contact portion of the tab thinner than the front contact portion; configured to make the back contact portion appropriate for attachment by means of spot welding; configured to provide transverse features to facilitate evacuation of air during a module lamination process.

It is intended that configuring the tab profile may provide some improvements, including, for example, features for alignment and retention of the tab by mechanical tooling; improved efficiency of the resulting solar cell module; reduced dimensional variation of the formed tab as compared to conventional commercially supplied wire; a crush zone to distribute compressive stress on the cell during attachment of tabs to cells; mitigation of thermal expansion during a thermal attachment process; or facilitate feeding and/or placement of the formed tabs.

In some of the cases above, the front contact portion of the tab may be polished in order to increase the front contact portion's reflectance. The polishing can be done at various appropriate points in the photovoltaic cell tab or module assembly.

According to another aspect herein, there is provided a system for forming photovoltaic cell tabs comprising: a feeding mechanism to feed wire; a first forming tool to trim and shape the wire to tabs; and a placement tool configured to match a profile of the tabs and place and attach the tabs on photovoltaic cells. The placement tool may sometimes be referred to as a tabber or a tabber/stringer, which may include a standard tabber/stringer, a tabber/stringer that had been modified to accept tabs that have a complex profile, or a new tool designed to accommodate tabs that have a complex profile.

In a particular case, the system may further comprise a second forming tool with trimming and forming dies to create a taper for the tab. In this case, the first forming tool and the second forming tool may be the same forming tool Forming tools may include, for example: a rotary die; a punch; a stamping die; a progressive die or other appropriate forming tools as may be understood by one of skill in the art.

In another particular case, the system may be configured such that a plurality of tabs are processed in parallel by duplicate tools.

In yet another case, the system may further comprise tooling to relieve stress in the formed tab. Stress relief may be provided by, for example: a rapid thermal treatment; variable tension; additional hot forming; or other appropriate forming methods/tools as may be understood by one of skill in the art.

It will be understood that in some cases, the system may not be directly connected to the placement tool but the formed tabs may be collected into an output media for later delivery to the placement tool and assembly with the photovoltaic cells.

According to a further aspect herein, there is provided a method of forming photovoltaic cell tabs comprising: forming wire into tabs with a complex profile in-line with a tabber/stringer apparatus; and excising lengths of the wire on feeding to the tabber/stringer apparatus.

In a particular case, the wire may be roll-formed. In another particular case, the wire may be press-formed in a holding fixture. It will be understood that other forming methods may also be used.

In a further particular case, the complex profile comprises: a front contact portion having a first profile; and a back contact portion having a second profile, wherein the first profile is dissimilar to the second profile.

Other aspects and features of the present disclosure will become apparent to those ordinarily skilled in the art upon review of the following description of specific embodiments in conjunction with the accompanying figures.

BRIEF DESCRIPTION OF FIGURES

Embodiments of the present disclosure will now be described, by way of example only, with reference to the attached Figures.

FIGS. 1A and 1B are illustrations of a front view and back view of a photovoltaic cell string;

DETAILED DESCRIPTION

Figure 2:
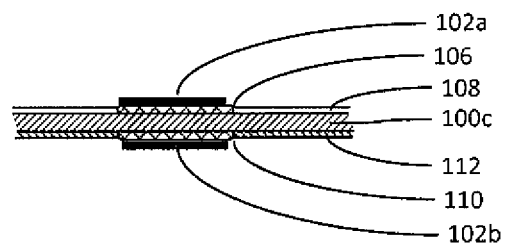
FIG. 2 shows a cross section of a photovoltaic cell.

Generally, the present disclosure provides methods and systems for forming photovoltaic (PV) cell tabs and cell tabs themselves. During the assembly of flat plate photovoltaic or solar modules, groupings of PV cells are connected in series to provide a series string. Several strings may then be combined to create larger series strings and/or parallel/series arrangements, which are integrated into a solar module. PV cells are connected by conductors, generally referred to as tabs that are typically connected at one end to front contacts of the PV cell and at the other end to back contacts. Strings of cells are produced by repeating this arrangement for a sequence of several cells in a process called tabbing and stringing. Machinery that implements this process is known as a tabber-stringer or combined tabber and stringer (CTS).

One consideration when manufacturing PV cells is that all of the cells in a string are intended to be closely matched for electro-optical properties in order to achieve better performance. Although this disclosure is generally directed at conventional mono or multi-crystalline silicon solar cells, the tabs, methods and systems described herein apply equally to other types of solar cells that have a generally planar form and are interconnected to form arrays of cells in a PV module, Copper Indium Gallium Selenide (CICS) cells constructed on a metal foil substrate being one example.

FIGS. 1A and 1B illustrate an example of a partially completed photovoltaic cell string, with a front view illustrated in FIG. 1A, and a back view, in FIG. 1B. A plurality of cells (100) is connected to produce a string of cells in series. Conventionally, at least one tab (102) spans at least two cells (100) and is attached at one end to front contacts of a cell (100) and at the other end to back contacts of an adjacent cell (100), except the first and last tab in the string, which are connected to a cell at only one end and in a later process can be connected to bus wires at the other end. Typically a small number of tabs, for example, 2, 3 or 4, may be used. Completed strings may typically consist of 6 to 12 or more cells (100) in series. The number of tabs is generally related to the width of the cells.

A typical photovoltaic cell (100) is made with tabs (102) of wire, which is typically pulled from a spool, straightened, flattened and pretensioned then cut to length to form individual tabs. Also, a Z-bend may be formed to accommodate the transition from the front of one cell to the back of an adjacent cell. Typically, two or three parallel tabs (102) are used to form interconnections between adjacent cells (100). Tabs (102) are commonly connected to metal contacts on the front and back of photovoltaic cells by soldering, where solder is scavenged from solder plate on the wire. Alternatively, solder may be added during the process or a conductive adhesive may be used instead.

As tabs (102) tend to be made of relatively reflective material, some light reflected by the tab (102) is directed out of the module and is lost. The flat profile of conventional tabs (102) has been shown to have a tendency to twist or curl during feeding, forming or attachment, which may result in misalignment of tabs (102) relative to cell contacts, which can result in shadowing of active portions of the cell resulting in string mismatch errors and reject strings.

FIG. 2 illustrates a cross section of a portion of a single photovoltaic cell (100) incorporated into a string, such as that shown in FIG. 1, with applied tabs (102). The photovoltaic cell (100) contains a front contact (106) and a back contact (110) designed to connect to the tabs (102). As shown, the width of the tabs (102) on either side of the photovoltaic cell (100) is the same on the front and the back according to the conventional practice, consequently the active area occluded by the front contact connection is determined by the desired conductivity of the tab. It may be observed that both top and bottom surfaces of a tab interconnecting adjacent cells are used to form a connection to the back contact of one cell (102b) and the front contact of an adjacent cell (102a) respectively. The photovoltaic cell further contains cell fingers (106), which radiate away from the front contact (106). Typically, a greater number of tabs (102) results in a reduced length of contact fingers used to conduct current from active areas of the cell to the tabs. The back side of the photovoltaic cell contains a back surface field (BSF) (112), which may typically be a conductive and reflective film designed to collect current and trap light. In the embodiments of the systems and methods herein, tabs are formed such that the portion attached to the front of a cell (102a) and the portion attached to the rear of the cell (102b) may differ in width, height, profile, cross section or some combination of these attributes. Furthermore, the tab may be formed in such a way that only one surface may be used to form a contact with the back contact of one cell and the front contact of an adjacent cell.

Figure 3:
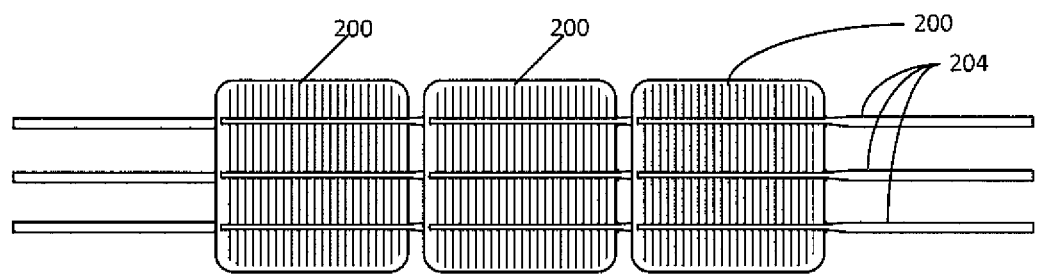
FIG. 3 illustrates a photovoltaic cell string with formed tabs.

FIG. 3 illustrates a string of photovoltaic cells (200). As can be seen from FIG. 3, tabs (204) are contoured and, by way of example, have a width that is narrower where the contoured tabs (204) are attached to a front surface of the cell (200). As shown in this figure, the tabs (204) have been formed to a shape that is intended to reduce optical losses and make the tabs (204) less visible. In addition to reducing the width of the tabs where they cover the front surface of the cell, they may be advantageously formed in such a way as to improve light capture, increase cross section, improve mechanical stiffness and straightness, provide mechanical alignment features, and the like, as described herein or as will be understood by one of skill in the art on reading this specification.

Figure 4A:
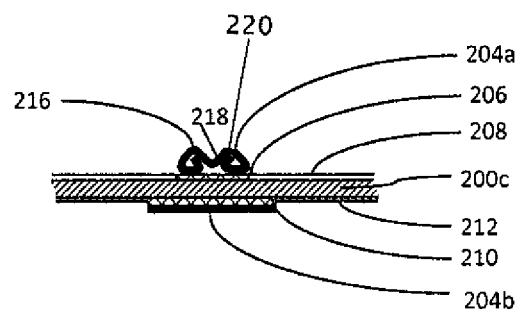
FIGS. 4A and 4B show cross sections of a photovoltaic cell with formed tabs.

FIG. 4A is an illustration of a cross section of a portion of a single photovoltaic cell (200) shown in FIG. 3 with the contoured tab (204a) attached at one end to a front contact (206) on a front side of the photovoltaic cell (200) and another tab (204b) at the other end to a back contact (210) at the back side of the cell (200). The photovoltaic cell (200) further includes cell fingers (208) connected to the front contact (206). The at least one back contact (210) may be attached to a back surface field (BSF) (212). Each tab (204) may be connected to a separate front or back contact, therefore the number of tabs being used for the PV cell may be directly correlated with the number of contacts for the PV cell. The formed tab (204a) consists of various peaks (216) and valleys (218). Additional features may include a slight gap on the bottom side of the front contact section to accommodate variations in raw material and a small interior void providing a crush zone to further accommodate material variation. The vertical features, such as the peaks (216) and valleys (218), provide possible landmarks for mechanically registering the tab (204) during placement. Additionally, the width of the tab (204) may be better controlled, that is, less variable than the width of the unformed ribbon wire as supplied, and may be made smaller than the width of the cell contact. These aspects of the formed tab are intended to reduce the misalignment of tabs to cell contacts and to reduce or minimize the possibility of tabs overhanging the edges of a front contact. The ribbon wire, forming the tabs, is shown as loosely wrapped for clarity but it may be preferred to have the tab compressed into a more tightly wound form. It may also be observed that the same surface of the ribbon wire is used to connect both the front contact of a cell (204a) and the back contact of an adjacent cell (204b); consequently, only one surface of the ribbon wire must be plated or tinned.

Figure 4B:
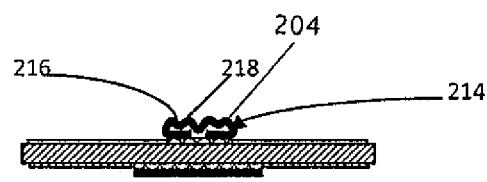

FIG. 4B illustrates a cross section of an alternative contoured tab (214) with a greater number of peaks (216) and valleys (218). Various different shapes are contemplated and may be manufactured by modifying where angular facets such as the peaks (216) and valleys (218) are incorporated into the tabs. As above, an open tab profile is shown for clarity; however, the tab may be compressed into a more tightly wound form. A single folding is shown in FIG. 4B, while FIG. 4A illustrates a higher degree of folding; however, further turns or contours could be performed depending on ribbon wire thickness. A single fold may be capable of reducing the front contact width to nearly half of the raw material width before allowing for any additional corrugations such as the peaks (216) and valleys (218).

The number of corrugations may vary from one to many depending on various factors. In particular, the overall height should remain less than the thickness of an encapsulant applied to the PV cell. On the other hand, it is desirable to maintain sufficient open volume to contain a significant volume of turned edges, which can contribute to stiffness and conductivity. When encapsulant film is used, typical encapsulant thickness may be in the range of 0.45 mm to 0.75 mm. While the front contact portion of a tab may protrude into the encapsulant, it may be preferable for the rear back not to protrude substantially from the back of a cell, which is intended to allow the encapsulant to function as insulation and may obviate the need for a spacer fabric and/or permit a reduction in the thickness of encapsulant used. In a conventional approach, a 156 mm PV cells may typically be connected by 3 tabs, each tab having a width of approximately 1.5 mm to 2 mm. The width of the tabs (204, 214) may be reduced to approximately 1 mm to 1.4 mm by using formed tabs with peaks (216) and valleys (218). Forming peaks (216) and valleys (218) may also increase the lateral stiffness of the tab (204, 214) and may provide features than can be used to locate and hold the tab (204, 214) in position during the attachment process of the tab (204, 214) to the PV cell (200) which will reduce or eliminate misalignment of tabs to front contacts which is a common process defect.

Forming the tabs so that the top surface is tilted can, if the tilt is sufficient, cause light to be captured by internal reflection of the module window, typically made of glass, such that a portion of the light reflected by the tab is subsequently reflected by the glazing onto the active surface of the cell. The tilt or inclination may be approximately half the critical angle of the window material plus an allowance for first surface texture and or diffuse sunlight with an adjustment for refraction at the glazing and encapsulant boundary. This provides additional benefits by increasing the amount of light that reaches an active area of a cell and making the tab less visible to an observer.

This method for forming PV cell contoured tabs (204, 214) may be applied as an in-line operation during the process of manufacturing a solar module. The tabs may be formed while feeding ribbon wire into a tabbing and stringing operation. In a conventional process, the ribbon wire may be straightened, prestressed and kinked (Z-bend) while being fed. This method for forming PV contoured tabs is intended to add further forming operations to the process, and is described in greater detail below.

Another aspect is that the feedstock may be formed after it is tinned or plated. Roll-forming is a process for modifying the shape of linear materials, particularly sheet stock and wire. The method for forming PV cell contoured tabs is intended to reduce the optical losses introduced by a tab lying on top of the PV cell. Since a top surface (220) of the contoured tab (204) made of ribbon wire is turned under, only this top surface (220) of the ribbon wire is tinned or plated in order to mediate interconnection with the cell contacts (206). The width of the ribbon wire used for the contoured tab may be wider or may vary because with the forming operation, the variation in width of the ribbon wire as supplied may have less effect on the width of the front contacts after forming.

Typically, tabs are attached to the back contact of a PV cell by solder or conductive adhesive and contacts are provided to permit this connection to the BSF. An alternative is to use relatively thin ribbon wire and spot-weld it, for example by using a laser, to the BSF (212) directly, eliminating the need for back contacts (210). Spot-welding may be appropriate as the shape of the back contact portion of the tabs (204, 214) may not contain the peaks and valleys and, as such, may be substantially different than the front contact portion; in particular, the back contact portion of the tab may be made in a profile conducive to welding or other attachment process. In forming tabs, the ribbon wire may be wider than the ribbon wire used for conventional tabs and, consequently, it may be possible to reduce the series resistance of the tab and the mechanical strength of the Z-bend without increasing the back contact and tab thickness.

Most of the light that strikes the horizontal top surface of a conventional tab is reflected out of the module; however, if the surface were tilted, more of the light would be trapped by internal reflection at the surface of the glazing up to an angle where the light may be entirely reflected (total internal reflection). Total internal reflection may occur for an inclination equal to approximately half of the critical angle of the glazing plus an allowance for the surface texture and diffuse sunlight. The internal reflection is described in further detail with reference to FIG. 8. In the case of glass as the window material, total internal reflection may occur for an inclination of approximately 21 degrees, about half the critical angle of glass, or a bit more allowing for commonly used textured glass and/or diffuse light. Since diffuse sunlight is typically strongest within a 15 degree angle, an allowance of approximately 7.5 degrees might be used. Forming the ribbon wire in this area could include the creation of angled surfaces. In this case, since forming may be done in part with a process tool, this extra contouring can be compatible with the material handling and soldering process requirements.

By using contoured tabs, the width of the front contacts can be reduced. Reduced front contact width may result in less occlusion of the active area of the cell and may reduce the propensity to form shunts during contact firing. Where it is desirable to reduce the height of the front tab, a more convoluted form with a greater number of smaller peaks (216) might be used. Generally, there is more available depth in a front encapsulation material than in a back encapsulation where typically a glazing mat or other separator may be absorbed into the thickness of the encapsulant. More complex contours can be used to reduce the maximum height of the front or top tab, although this may increase the complexity of the forming tool used to form the tab. In order to facilitate penetration of the front contact portion, the front contact portion of the tab may additionally be formed with transverse grooves or relief features to facilitate de-airing and promote encapsulant flow during lamination.

Conventionally, the tab contact area is rectilinear. A rectilinear shape may not be a preferred geometric shape since a trapezoidal shape has been shown to result in reduced series resistance for the same total front contact area. It may be preferable to increase the cross-section of the tab along its length in proportion to increasing current density.

Figure 5:
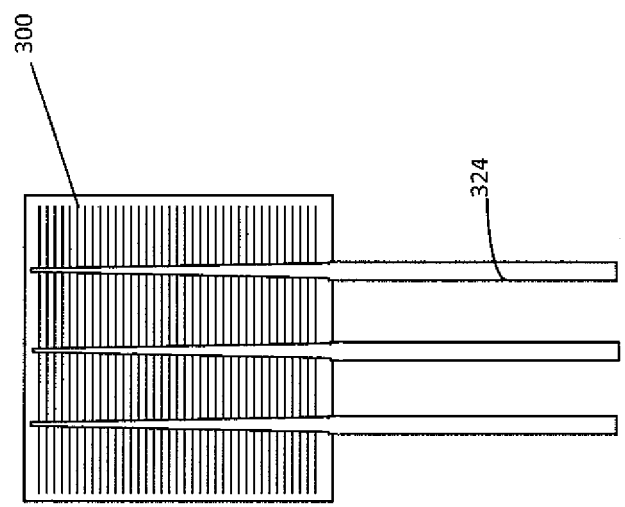
FIG. 5 illustrates a photovoltaic cell with tapered tabs.

A more trapezoidal shape may be achieved if the tab is also trimmed and formed into a taper during the forming operation, as shown in FIG. 5. An advantage of creating a taper during the forming operation may be that cross section can be modulated in two dimensions whereas conventional approaches were constrained to one dimension (width).

FIG. 5 illustrates tabs (324) that are tapered along the length of the front-side portion and attached to a photovoltaic cell (300). These tapered tabs (324) may cover the same area as conventional tabs (102) but may also result in a reduced effective series resistance as the wire cross section increases in the same direction as current density. This is intended to improve performance by integrating the method for forming tabs with bulk feeding of wire stock. The method for forming tapered tabs (324) may be combined with the formation of a contoured tab (204, 214). Conventional tabs have a constant width, which has been shown to be less than optimum as wire gauge does not increase with current from one end to the other. Varying the cross section of the tab along its length is intended to improve current carrying capacity without increasing surface area used.

Figure 6:
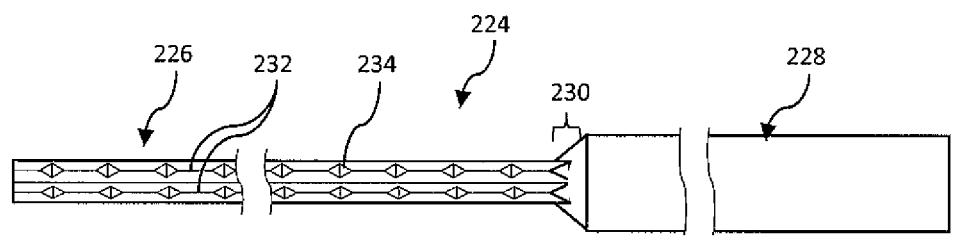
FIG. 6 illustrates a possible configuration of a tab.

FIG. 6 is another possible configuration of a contoured tab (224), which could be formed by simple tooling. Conventional tabs have a fixed linear profile and can be considered a two dimensional structure. FIG. 6 shows the contoured tab (224) with a front contact portion (226) of the tab as a three dimensional structure. More complex structures could be tooled, if desired. The tab (224) may include a flat back contact section (228) and a Z-bend section (230). The tab (224) may further be tooled to allow for provision of some transverse features, such as peaks and valleys or ridges and creases. In this example, additional relief for de-airing and encapsulant flow is provided by intermittently forming creases (234) across the ridges (232). Tabs (224), as shown, are intended to enhance performance, by for example, reducing optical and series resistance losses, even when applied to conventional PV cells. This example shows how the width of the front contact area is reduce, compared to the overall width of the raw material, the ribbon wire, along with the addition of ridges with a sloped face that is intended to enhance the capture of reflected light. The provision of transverse features can improve the lamination process yield. This example shows two parallel peaks or ridges (232) with transverse depressions or creases (234); however, the number of ridges (232) could be different and could be determined by the details of the application. The shape and orientation of the creases (234) could also differ. Altering these features is intended to improve light trapping, reduce shadowing and facilitate lamination.

Formed tabs (224) may also contain a separate or different front contact (226) and back contact structure (228) as the structures may differ in height as well as width. This approach may be advantageous over a simple linear structure and/or having individually precut tabs and/or having tabs of constant thickness. An additional benefit may be that the width of the section is controlled by the forming tool, which may allow for more consistent ribbon wire width as ribbon wire width may vary over its length and from one reel to the next. Stock width variation can be accommodated by leaving some relief in the area where edges are turned under. This portion of the tab (224) may be folded into a thin flat shape.

In some cases, the front contact portion is prestressed or pretensioned by the forming operation. The back contact portion may be prestressed by applying tension, while the front contact portion is engaged in the forming dies or it may be prestressed by roll forming. The ability to have a wider back contact section may allow the overall cross-section of the wire to be greater, which may reduce series resistance and make the connection potentially more robust as the amount of material in the area can be increased. Also, the increased vertical stiffness in the upper bend may reduce the risk of shunting at the edge of the cell. It may also be possible to eliminate the use of back contacts as there may be synergy with laser-fired back contact cell technology, in which aluminum is fired through a dielectric passivation or surface treated layer.

The formed tabs include an apex of convolutions, such as ridges (232) and creases (234) formed into the tapered tab. As shown in FIG. 6, the ridges (232) run more or less parallel to the long axis of the tab. A relatively high slope, preferably in excess of 21 degrees, may be preferred on the sides of these ridges (232) so that reflected light will be trapped. To reduce shadowing near the edge of the contact for obliquely incident light a downward slope near the edges of the front contact portion of the tab (224) may be included. This structure is intended to not unduly increase the shadow losses due to increased structure height. These features can be provided to only the portion of the tab (224) where they have a functional purpose. This arrangement may allow the structure to be maintained without presenting any issues for the attachment of the tab (224) to the back of the PV cell. This structure further may serve to improve the stiffness of the front contacts, which can help in achieving optimal alignment to the cell contacts. Also, this structure provides distinct features such as the ridges (232) themselves and/or the intervening creases (234), which can be engaged by the tooling, such as grippers and hold-downs, resulting in better control over placement.

The number of ridges and creases may be increased or decreased depending on the tooling used and the number desired for use with the PV cell and may include a variable number of ridges and creases along the length of the formed tab. As well, these peaks provide a means of increasing the conductor or tab cross-section while reducing width. The ridge pattern of FIG. 6 shows a repetitive pattern. One element of these transverse features is to facilitate lamination, although they may also serve in some way to facilitate bonding of the tab to the cell. The provision of these features can improve the lamination process yield, as compared to other methods where tabs, particularly contoured tabs, which do not have transverse features, by reducing voids and other de-laminations that could occur if air is trapped in the valleys, between the ridges or if there is insufficient plastic flow of encapsulant through the valleys, as shown previously in FIGS. 4A and 4B. Compared to tabs with a continuous ridge structure, this formed tab (224) is intended to reduce entrapment of air and out-gassing in the interior valleys of the tab (224).

Figure 7:
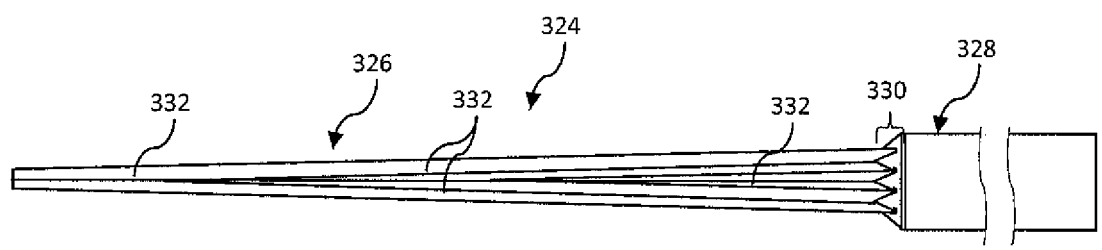
FIG. 7 illustrates a tab with multiple ridges.

FIG. 7 illustrates an example of a single tapered and formed tab (324), where multiple ridges (332) coalesce as the tab (324) is tapered into a continuously narrowing profile, which provides the combined benefits of taper and contour. In this example, the tapered tab (324) with several ridges (332) merging into fewer ridges following the taper from a back contact section (328) through a Z-bend section (330) to a front section (326). The number of ridges (332) and amount of taper could be varied and could include additional transverse features as described above. The intended benefit is the reduction of optical losses, by means of reduced contact area and increase light capture, in combination with a more effective reduction in series resistance or alternatively a reduction in optical losses keeping series resistance constant. Increases in module efficiency could exceed approximately 2.5%.

The tab shape could be produced by variable pitch roller dies or other progressive dies. Transverse creases, such as those illustrated in FIG. 6, are not shown but could be applied as well. Creases might be applied advantageously to ease the transitions where ridges and valleys merge and divide. This may require a more complex die set with moving parts or large diameter rotary dies if roller dies are used. Also excising material prior to forming the taper may result in some scrap. This is a more complex shape; however, if a rotary die or stamping die is used to create the shape, there may be a similar degree of difficulty in creating the shape with or without the taper.

With the addition of a taper, the back contact portion may practically be even wider. The transition from a roll form to a flat form provides a robust upper bend of the Z-bend (330) with less localized bending than occurs with a flat ribbon while the lower bend is essentially the same. Also, the increased vertical stiffness in the upper bend may reduce the risk of shunting at the edge of the cell.

Figure 8:
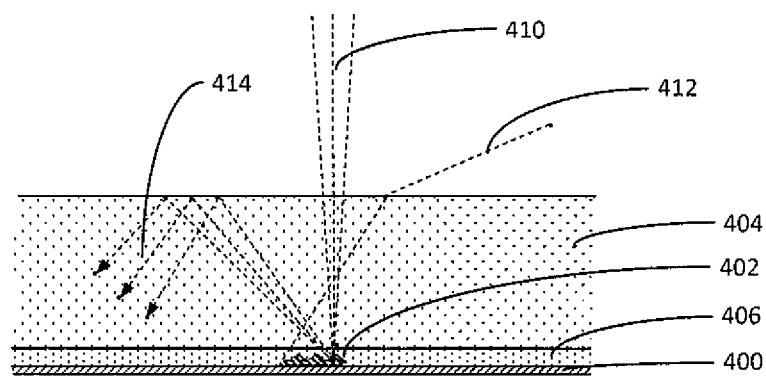
FIG. 8 illustrates a cross section a photovoltaic cell with reference to optical relationships.

FIG. 8 illustrates a cross-section of a tab (402) redirecting incoming light (410). The inclined surfaces of the tab (402) may have a tilt, which is at least half the critical angle of a glazing (404) of the PV cell (400), plus an additional allowance for surface texture of the glazing (404) and/or capture of diffuse light. An encapsulant (406) is located between the front glazing (404) and the PV cell (400). It may be preferred that slope of the inclined surfaces of the tab (402) does not exceed an angle that may start to cause unwanted shading when the incoming light is substantially off-axis or with a highly oblique angle of incidence (412). Also, the preferred contour may depend on application, for example, fixed mount or tracker installations. In the case of fixed installation, it may be desirable to optimize for somewhat different conditions, for example 30 degree incidence. Sunlight subtends approx. 0.53 degrees of arc; however, in practice substantial diffuse components fill a much larger included angle, typically up to 15 degrees full width at half maximum (FWHM). On-axis gain is important for peak or mid-day response or all day if a good tracker is used.

Light that strikes the glazing (404) at or beyond its critical angle, which for conventional solar glass is approximately 41.5 degrees, is totally reflected while light near the critical angle is mostly reflected with the lateral displacement due to twice the thickness of the glazing (404) causing it to fall to one side or the other of the tab (402). Since solar glazing is frequently textured, the reflected light (414) may be more broadly scattered. In some cases the glazing may be anti-reflective coated, which will increase the critical angle, for example increased to approximately 48 degrees for Teflon glazing film. Since reflected light mirrors the angle of incidence, a surface inclination of at least half the critical angle of the glazing is intended to result in light with normal incidence being completely trapped by total internal reflection.

Shadowing at the edges of the tab (402) should be considered for fixed installations, where shading of obliquely incident light could be an issue. Normally, sunlight beyond 65 degrees incidence or so, depending on the optical properties to the PV module, typically ineffective due to optical losses. After refraction in the glazing and encapsulant, the angle of incidence is reduced so that any practical slope of the inclined surfaces of the tab below approximately 36 degrees is appropriate in terms of avoiding shadowing of the underlying PV cells; active area.

Figure 9:
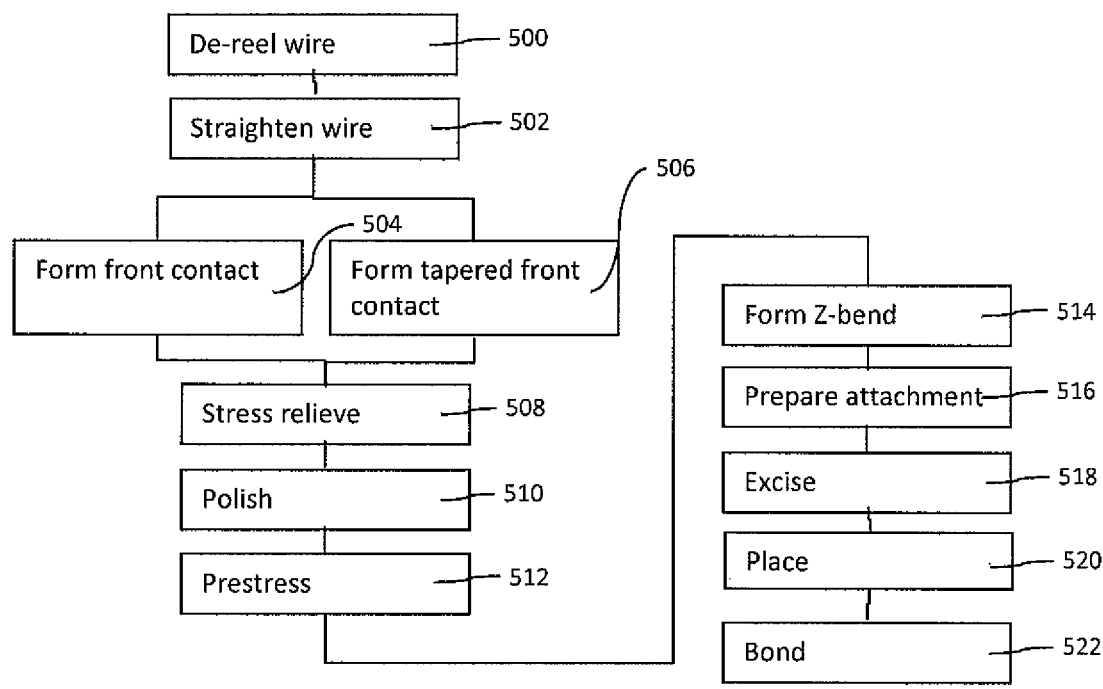
FIG. 9 is a flowchart of a system and method for forming photovoltaic cell tabs.

The tabs may be formed of the ribbon wire by means of progressive roller dies as the wire is pulled from a supply spool during a tabbing and stringing operation, an example of which is illustrated in FIG. 9. Alternatively, this method could be performed during the conversion process where sheet stock is slit into ribbon or during the forming process where round wire is rolled into flat wire. In this case, tabs may be fed from a reel in partially or completed shaped form, thereby reducing the complexity of the tabber-stringer tooling.

The methods are intended to provide a better balance between optical losses and resistance losses as a given gauge of flat wire can be configured to have significantly lower optical losses. The method and the corresponding tabs are intended to:

reduce shadowing through reduction of wind and beneficial reflections from inclined surfaces;

reduce series resistance through the use of wider ribbon wire while mitigating the normal shadow losses;

reduce tab misalignment through improved stiffness and possibility of guidance using surfaces contours; and further reduce series resistance through the use of a tapered contact area.

The method for forming tabs may tin the top surface of the ribbon wire, during the conversion and after de-reeling (500) and straightening (502). Yet another alternative is to use round wire as a feedstock. An advantage of using round wire may be that flattened wire produced in this way has negligible burring at its edges as compared to ribbon wire which is generally sheared or slit from sheet material, for example, the edges of the back contact of the formed tab. This approach may be extended to incorporate additional roll forming to arrive at the desired profile. When tabs are formed from flat wire, more rolling and compression is required, however, a tapered form may be more readily achieved, for example by die cutting, than with solid wire. When tabs are formed from round wire, additional stress induced embrittlement may be expected. While the forming operation could likely be done by a converter (material supplier), it could also be performed in-line for example, incorporated into the feed mechanism of a tabber-stringer tool. The forming operation could, if necessary, be followed by a rapid annealing step such as passing the formed tab through a tubular quartz heater, a laser line source or even a flame in order to relieve some of the stresses induced by the forming operation and/or to improve the reflectance of the contoured surfaces by reflowing the surface plating or tinning. Tinning, if done following the forming operation would typically involve passing the tab through a solder fountain.

The method may then use a forming tool to form, trim and/or taper (504, 506) the flat or ribbon wire to form the geometric shape of the tabs. If forming a more rectilinear tab, the method use the ribbon wire in the standard width and without a tapering operation and may use a forming tool to form (504) peaks and valleys. The method of tapering the tabs consists of feeding the material in bulk into the tabbing and stringing operation and allows for variation of the cross section in two dimensions. The ability to form a taper (506) requires a minor increase in the complexity of the forming tool and may create some scrap if excess material is trimmed away while forming the taper. The method may vary the cross section in two dimensions, which may produce a better result and preferably the cross section is proportional to longitudinal position. The tapered shape could be produced by roller dies, smaller variable pitch roller dies, progressive forming dies and/or stamping dies.

By mechanically forming the tab (504), the width of the tab, particularly in the front contact section, may be controlled by the forming tool, which may lead to more consistent tab width from one ribbon wire supply reel to the next. Alternatively, material may be supplied to a tabber-stringer in a substantially finished form, in which case a simpler indexing and cutting operation may be sufficient. Also, bulk feeding, such as reel feeding, of tab material may be preferable to feeding individual piece parts particularly in high-speed automation, where the current feed rates are typically about 3700 tabs per hour (for example, 1200 cells per hour net throughput with 3 tabs per cell). In other approaches, individual die cut piece parts may be fed in trays, which may be more difficult to process in terms of part damage, cost and feed rates.

One limitation of the use of narrow or tapered tabs may be that PV cells with a corresponding front contact shape are required. Use of a rectilinear shape may be advantageous without the use of specialized PV cells, if it is used only to reduce series resistance and improve light trapping. Also, slightly reduced width may increase the tolerance to slight misalignment of tabs to cell contacts.

The method forms the tabs (504) by making peaks, ridges, valleys and or creases depending on the contours desired. The forming of the tabs may be done in addition to or instead of tapering the tabs (506). Forming sections of ribbon wire while excising lengths of wire from the supply reel in a tabber-stringer. Sections can be roll-formed, a process for modifying the shape of linear materials, while feeding the wire and/or press formed in a holding fixture. Ribbon wire is converted into the desired profile by progressively bending, folding and compressing the material as it is fed linearly through a forming tool. These steps to form one or more corrugations in the material which present inclined reflective surfaces to turn under the edges of the wire, which not only further narrows the profile but brings the plated surface to the bottom side of the resulting profile so that this surface becomes solderable. After forming the tab, the method may include steps such as stress relief (508), polishing (510) and pre-stress (512), of the tabs. A complex cold formed shape may be at least partially stress relieved by progressive forming. Since one possible advantage of a formed tab is improved light utilization by reflection, the reflectance of the formed surface may be improved by polishing which might be implemented by buffing the surface, for example with a soft buffing wheel, or by reflowing the plating, for example with a hot air jet. This process may also be used to remove flux residues resulting from the soldering process. Generally, tabs are prepared for the thermal stress created by a soldering process by gently stretching the material lengthwise, typically by pulling on it using force and/or final length as a limit.

A transition between convoluted and flat profile delineates the parts of the tab used to connect front contacts (contoured) and back contacts (flat) of adjacent cells while facilitating the formation of a Z-bend (514) at or near this transition. This transition may be formed with the use of a die with moving parts whose position can be varied to produce a smooth transition. While wire is compressed into a narrow width with increased lateral structure in the front contact section, the wire can be made to be relatively thin and wide in the back contact sections such that the ribbon wire may be spot-welded, for example, by using a laser, to the back surface field, which may eliminate the need for back contacts.

While there may be some stressing of the wire due to cold forming, if at least minimal bend radii are maintained, the forming operation may strengthen the resulting structure. The formed material may be compressed to final shape; normally, some avenue of escape for excess material (flash) is provided but in some cases the raise ridges and/or a small separation of turned edges may provide a volume to capture any excess material. In use, in addition to the forming mechanism, tooling is provided to which is intended to partially stress relieve the material by stretching to a controlled tension. Additionally, a Z bend is cold-formed into the tab and the overall length is determined by parting off the tab from the bulk material.

Once the tab is formed in the desired contour and/or taper is formed on the tap, the tab is ready to be attached (516) to the PV cell. The tabs may be excised (518) prior to being placed (520) on the PV cell. The tabs may be connected to the contacts of a PV cell through a tabber-stringer machine. Tabs may be manipulated in a number of ways during placement and it is desirable to maintain good alignment to the front contact of the cell. With a formed tab the pattern of peaks and valleys, preferably the valleys, can be used to center the tab to the tooling by having corresponding features in the tool. Similarly, hold-downs, which hold the tab in position during the attachment process, for example thermal, air-jet or laser soldering, UV or thermal curing, or other like method, can be shaped to maintain lateral position of the tab. While the additional structure introduced by forming of the tab will help to resist curling that can cause misalignment, preferably there may be some allowance for inch-worming that may occur during soldering; however, as long as the angular profile and aspect ratio is sufficiently small, this should not be a problem. After being placed, the tabs are then bonded (522) to the PV cell.

When performed in-line, this method permits on-demand forming of feedstock into a required configuration. This modification to the tabbing & stringing process provides a simple means of improving cell/module efficiency by reducing shadowing losses associated with the bus wire and/or reducing the series resistance of the bus contact. This modification consists of selectively forming the ribbon wire, which attaches to the front contact of a PV cell in order to improve its optical and/or functional attributes. The forming process is intended to include some or all of the following:

narrowing the ribbon wire to achieve less shadowing;
creating angled facets to create oblique reflections to reduce the amount of light lost to shadowing;
increasing the cross-section of ribbon wire without increased shadowing to reduce series resistance; and/or
creating a tapered contact area to reduce series resistance.

While it is preferred to form tabs during an in-line operation, there may be cases where an off-line or separate operation is preferred. This may extend the usefulness of the formed tab approach to existing tabber-stringer equipment. Several converters have the capability of roll forming sheet materials during slitting and reeling operations. These converters provide the option of using preformed tabs. Pretensioning, Z-bend formation and cut-off may still be performed during the tabbing-stringing process. The additional requirement is that the tabber-stringer be able to automatically synchronize its operations to the preformed pattern through use of sensors, vision systems, etc. Optionally, a separate system may be used to supply formed tabs to a conventional tabber-stringer machine.

Photocurrent is lost in a conventional tab due to shadowing by the front contacts and tabs. The contact area can be reduced; however, series resistance will increase unless the ribbon wire is also made thicker which would result in an overall thickening of the module. Also, when contacts are made wider, for example to reduce series resistance, shunts associated with overheating of metalized areas during the contact firing process are more probable. In a typical 156 mm cell with two 3 mm tabs, this shadow loss is approximately 3.85%. Alternatively, if tabs are reduced to 2 mm, shadow loss is approximately 2.55% but cross section is reduced and series resistance is increased by 50%. Typically, three narrower tabs are used for 156 mm cells. If three 1.5 mm tabs are used for 156 mm cells, shadow loss is approximately 2.88% but with increased cross section (12.5% as compared to two 2 mm tabs) and reduced resistance losses in the fingers of approximately 33%.

The method of formed tabs includes forming ribbon wire in the front contact area is compressed in width while maintaining cross section, being formed into contours that promote the displacement of encapsulant but is not intended to affect the backside contact structure or process. The encapsulant can be displaced over the front contact but the encapsulant is not intended to be displaced over the back contact where the encapsulant provides functional insulation and is typically constrained by a mesh or other filler to ensure that a minimum thickness is maintained. This increased tab thickness may be partly offset as the ribbon wire may only need to be tinned on one side, in the back contact section. Depending on the formed shape, the contact width may be reduced by at least half for a given width of ribbon wire. For example, 3 mm wide ribbon wire might be formed into an approximately 1.4 mm wide front contact section.

A system for forming the tabs is contemplated and would include a forming tool to trim and shape ribbon wire as the wire is pulled from the reel and prepared for use in a tabbing/stringing operation; a forming tool with variable pitch trimming and forming dies to create a taper during what is essentially a web process; a feeding mechanism with alignment features to reel feed ribbon wire with preformed contours if off-line forming is used; and placement/hold-down/solder tooling configured to match ribbon wire contours for improved alignment.

The anticipated or intended impact on product performance includes:
a 20% reduction in series resistance and 40% and typically 50% or greater reduction in the contribution of tabs;
approximately a 2 to 3% (absolute) increase in module efficiency using conventional cells or possibly more depending on implementation details; and approximately 0.5% increase in tabber/stringer yield, primarily through reduction of tab to contact misalignment, edge shorts, thermal and mechanical stress during attachment, etc.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein are implemented as a software routine, hardware circuit, firmware, or a combination thereof.

Embodiments in the disclosure or elements therein, can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A photovoltaic cell tab comprising:
   a front contact portion having a top surface and a bottom surface and a first profile; and
   a back contact portion having a second profile,
   wherein the first profile is formed such that the top surface is laterally folded under the bottom surface such that a top surface of the front contact portion is configured to contact a photovoltaic front contact and the profile provides an interior void.

2. A photovoltaic cell tab of claim 1 wherein the first profile further comprises complex shapes intended to affect incident light in a predetermined manner.

3. A photovoltaic cell tab of claim 1 wherein the first profile comprises angular facets configured to affect incident light in a predetermined manner.

4. A photovoltaic cell tab of claim 3 wherein the angular facets are configured to reflect incident light obliquely.

5. A photovoltaic cell tab of claim 3 wherein the angular facets are configured to reflect incident light such that it falls on active portions of the cell to produce photocurrent.

6. A photovoltaic cell tab of claim 3 wherein the angular facets are configured to reduce the amount of incident light that is visibly reflected thereby making the tab less visible.

7. A photovoltaic cell tab of claim 3 wherein the angular facets are configured as ridges and grooves in longitudinal, transverse or complex patterns.

8. A photovoltaic cell tab of claim 1 wherein the second profile does not include angular facets.

9. A photovoltaic cell tab of claim 1 wherein only one side of the tab is tinned.

10. A photovoltaic cell tab of claim 9 wherein the tab is configured so that the tinned side of the tab makes contact with both the front contact area of one cell and the back contact area of another cell.

11. A photovoltaic cell tab of claim 1 wherein at least a portion of the transverse width of the tab is tapered.

12. A photovoltaic cell tab of claim 11 wherein the taper is provided to the transverse width of the front contact portion of the tab, the transverse width of the back contact portion of the tab, or both.

13. A photovoltaic cell tab of claim 1 wherein the first profile is configured to increase the lateral stiffness of the tab.

14. A photovoltaic cell tab of claim 1 wherein the second profile is configured to make the back contact portion of the tab thinner than the front contact portion.

15. A photovoltaic cell tab of claim 1 wherein the second profile is configured to make the back contact portion appropriate for attachment by means of spot welding.

16. A photovoltaic cell tab of claim 1 wherein the first profile or second profile are configured to provide transverse features to facilitate evacuation of air during a module lamination process.

* * * * *